(12) United States Patent
Ye

(10) Patent No.: US 11,309,891 B2
(45) Date of Patent: Apr. 19, 2022

(54) LEVEL SHIFTING CIRCUIT

(71) Applicants: Semiconductor Manufacturing International (Shanghai) Corporation, Shanghai (CN); Semiconductor Manufacturing International (Beijing) Corporation, Beijing (CN)

(72) Inventor: Guo Zhen Ye, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/953,692

(22) Filed: Nov. 20, 2020

(65) Prior Publication Data
US 2021/0288649 A1    Sep. 16, 2021

(30) Foreign Application Priority Data
Mar. 13, 2020    (CN) .......................... 202010176645.6

(51) Int. Cl.
*H03K 19/0185*    (2006.01)
*H03K 3/356*    (2006.01)

(52) U.S. Cl.
CPC ............... *H03K 19/018521* (2013.01); *H03K 3/356113* (2013.01); *H03K 3/356182* (2013.01)

(58) Field of Classification Search
None
See application file for complete search history.

(56) References Cited

U.S. PATENT DOCUMENTS

| | | | | |
|---|---|---|---|---|
| 8,736,346 | B2* | 5/2014 | Shimizu | 327/333 |
| 2004/0000929 | A1* | 1/2004 | Aoki | H03K 3/012 |
| | | | | 326/68 |
| 2016/0352315 | A1* | 12/2016 | Blecher | H03K 19/018528 |
| 2020/0373885 | A1* | 11/2020 | Appel | H03F 1/0211 |
| 2021/0288649 | A1* | 9/2021 | Ye | H03K 19/018528 |

* cited by examiner

*Primary Examiner* — Menatoallah Youssef
*Assistant Examiner* — Khareem E Almo
(74) *Attorney, Agent, or Firm* — Crowell & Moring LLP

(57) ABSTRACT

The present application is directed to a level shifting circuit. In one form, a level shifting circuit includes a first inverter, a level shifting unit, and a fast driving unit. The first inverter is configured to invert an input signal received at an input node and to output an inverted input signal to a second input node. The level shifting unit is configured to perform amplitude up-shifting processing on a received input signal. The fast driving unit is configured to pull up an output signal of an output node of the level shifting unit by increasing a discharge current of the level shifting unit when receiving the input signal.

16 Claims, 3 Drawing Sheets

LEVEL SHIFTING CIRCUIT

RELATED APPLICATIONS

The present application claims priority to Chinese Patent Appln. No. 202010176645.6, filed Mar. 13, 2020, the entire disclosure of which is hereby incorporated by reference.

BACKGROUND

Technical Field

The present disclosure relates to the field of semiconductor integrated circuits, and in particular, to a level shifting circuit.

Related Art

A level shifting circuit can shift an input voltage signal with a lower amplitude to a voltage signal with a higher amplitude and output the voltage signal, which has been widely used in integrated circuits.

However, a range of a voltage signal input by an input node of an existing level shifting circuit is relatively small, thereby limiting a use range of the level shifting circuit.

SUMMARY

A problem addressed by the present disclosure is to increase a range of a voltage signal input by an input node of a level shifting circuit, and to increase an application range of the level shifting circuit.

In order to address the foregoing problem, the present disclosure provides a level shifting circuit may include a first inverter, a level shifting unit, and a fast driving unit. The first inverter is adapted to invert an input signal received by an input node of the level shifting circuit and output an inverted input signal to a second input node of a level shifting unit. An input node of the first inverter is coupled to the input node of the level shifting circuit, and an output node of the first inverter is coupled to the second input node of the level shifting unit. The level shifting unit is adapted to perform amplitude up-shifting processing on the input signal received by the input node of the level shifting circuit. A first input node of the level shifting unit is coupled to the input node of the level shifting circuit, the second input node of the level shifting unit is coupled to the output node of the first inverter. The first power node of the level shifting unit is coupled to a first power voltage, and a second power node of the level shifting unit being coupled to a second power voltage. The fast driving unit is adapted to pull up an output signal of an output node of the level shifting unit by increasing a discharge current of the level shifting unit when receiving the input signal.

In some implementations, the level shifting unit includes a first N-type metal-oxide-semiconductor (NMOS) transistor, a second NMOS transistor, a first P-type metal-oxide-semiconductor (PMOS) transistor, and a second PMOS transistor. A gate terminal of the first NMOS transistor is coupled to the first input node of the level shifting unit, a source terminal of the first NMOS transistor is coupled to the first power node, and a drain terminal of the first NMOS transistor is coupled to a drain terminal of the first PMOS transistor. The drain terminal of the first PMOS transistor is coupled to a gate terminal of the first PMOS transistor and to a gate terminal of the second PMOS transistor, and a source terminal of the first PMOS transistor is coupled to the second power node. A source terminal of the second PMOS transistor is coupled to the second power node, and a drain terminal of the second PMOS transistor is coupled to the output node of the level shifting unit. A gate terminal of the second NMOS transistor is coupled to the output node of the first inverter, a source terminal of the second NMOS transistor is coupled to the first power node, and a drain terminal of the second NMOS transistor is coupled to the output node of the level shifting unit.

In some implementations, the level shifting circuit may further include a current cut-off unit adapted to cut off a discharge path between the second power node and the first power node when the output signal of the output node of the level shifting unit is a high-level signal.

In some implementations, the current cut-off unit may include a second inverter and a third NMOS transistor. An input node of the second inverter is coupled to the output node of the level shifting unit, and an output node of the second inverter is coupled to a gate terminal of the third NMOS transistor. A source terminal of the third NMOS transistor is coupled to the drain terminal of the first NMOS transistor, and a drain terminal of the third NMOS transistor is coupled to the drain terminal of the first PMOS transistor.

In some implementations, the level shifting circuit may further include a first voltage clamping unit adapted to clamp the output signal of the output node of the level shifting unit at a high level when the output signal of the output node of the level shifting unit is a high-level signal.

In some implementations, the first voltage clamping unit may include a third PMOS transistor and the second inverter. A gate terminal of the third PMOS transistor is coupled to the output node of the second inverter, a source terminal of the third PMOS transistor is coupled to the second power node, and a drain terminal of the third PMOS transistor is coupled to the output node of the level shifting unit.

In some implementations, the level shifting circuit may further include a rectifying unit coupled between the output node of the level shifting unit and an output node of the level shifting circuit and adapted to rectify the output signal output by the output node of the level shifting unit and output a rectified output signal.

In some implementations, the rectifying unit may include a third inverter and a fourth inverter. An input node of the third inverter is coupled to the output node of the level shifting unit, an output node of the third inverter is coupled to an input node of the fourth inverter, and an output node of the fourth inverter is coupled to the output node of the level shifting circuit.

In some implementations, the fast driving unit may include a first fast driving subunit and a second fast driving subunit. The first fast driving subunit is adapted to increase a discharge current of the discharge path between the second power node and the first power node when an input signal of an input node of the level shifting unit is a high-level signal. The second fast driving subunit is adapted to increase a discharge current of a discharge path between the output node of the level shifting unit and the first power node when the input signal of the input node of the level shifting unit is a low-level signal.

In some implementations, the first fast driving subunit may include a fourth NMOS transistor, a fifth NMOS transistor, and a sixth NMOS transistor. A gate terminal of the fourth NMOS transistor is coupled to a preconfigured first bias voltage, a source terminal of the fourth NMOS transistor is coupled to a drain terminal of the fifth NMOS transistor, and a drain terminal of the fourth NMOS transistor is coupled to the drain terminal of the first NMOS transistor. A gate terminal of the fifth NMOS transistor is coupled to a preconfigured second bias voltage, and a source terminal of the fifth NMOS transistor is coupled to a drain terminal of the sixth NMOS transistor. A gate terminal of the sixth NMOS transistor is coupled to the input node of the level shifting circuit, and a source terminal of the sixth NMOS transistor is coupled to the first power node.

In some implementations, the fourth NMOS transistor is a thick-gate-oxide NMOS transistor, and the fifth NMOS transistor and the sixth NMOS transistor are thin/thick-gate-oxide NMOS transistors.

In some implementations, the second fast driving subunit may include a seventh NMOS transistor, an eighth NMOS transistor, and a ninth NMOS transistor. A gate terminal of the seventh NMOS transistor is coupled to the first bias voltage, a source terminal of the seventh NMOS transistor is coupled to a drain terminal of the eighth NMOS transistor, and a drain terminal of the seventh NMOS transistor is coupled to the output node of the level shifting unit. A gate terminal of the eighth NMOS transistor is coupled to the second bias voltage, and a source terminal of the eighth NMOS transistor is coupled to a drain terminal of the ninth NMOS transistor. A gate terminal of the ninth NMOS transistor is coupled to the output node of the first inverter, and a source terminal of the ninth NMOS transistor is coupled to the first power node.

In some implementations, the seventh NMOS transistor is a thick-gate-oxide NMOS transistor, and the eighth NMOS transistor and the ninth NMOS transistor are thin/thick-gate-oxide NMOS transistors.

In some implementations, the first bias voltage is generated by a first bias voltage generating circuit. The first bias voltage generating circuit may include the second power voltage and a first voltage divider resistor coupled to the second power node. A first end of the first voltage divider resistor is coupled to the second power node, and a second end of the first voltage divider resistor serves as an output node of the first bias voltage generating circuit to output the first bias voltage.

In some implementations, the second bias voltage is generated by a second bias voltage generating circuit, which may include the second power voltage and a second voltage divider resistor coupled to the second power node. A first end of the second voltage divider resistor is coupled to the second power node, and a second end of the second voltage divider resistor serves as an output node of the second bias voltage generating circuit to output the second bias voltage.

In some implementations, when the second power voltage is 1.8 V, the first bias voltage is 1.3 V to 1.4 V, and the second bias voltage is 0 V to 0.9 V.

In some implementations, the gate terminal of the first PMOS transistor and the gate terminal of the second PMOS transistor are used as a first node, and the level shifting circuit may further include a second voltage clamping unit adapted to clamp a voltage of the first node at a high level when the output signal of the output node of the level shifting unit is a low-level signal.

In some implementations, the second voltage clamping unit may include a fourth PMOS transistor. A gate terminal of the fourth PMOS transistor is coupled to the output node of the level shifting unit, a source terminal of the fourth PMOS transistor is coupled to the second power node, and a drain terminal of the fourth PMOS transistor is coupled to the first node.

Compared with the prior art, the technical solutions of the present disclosure have the following advantages:

In the foregoing solutions, when the fast driving unit receives the input signal, the output signal of the output node of the level shifting unit is pulled up by increasing the discharge current of the level shifting unit, so that normal operation of the level shifting circuit can be ensured when a level of the input signal is relatively low, thereby improving working reliability of the level shifting circuit and increasing an application range of the level shifting circuit.

DETAILED DESCRIPTION

It can be learned from the background that, when a voltage signal of an input signal of an input node of an existing level shifting circuit is relatively small, a driving speed is relatively slow or the level shifting circuit cannot operate normally.

Figure 1:
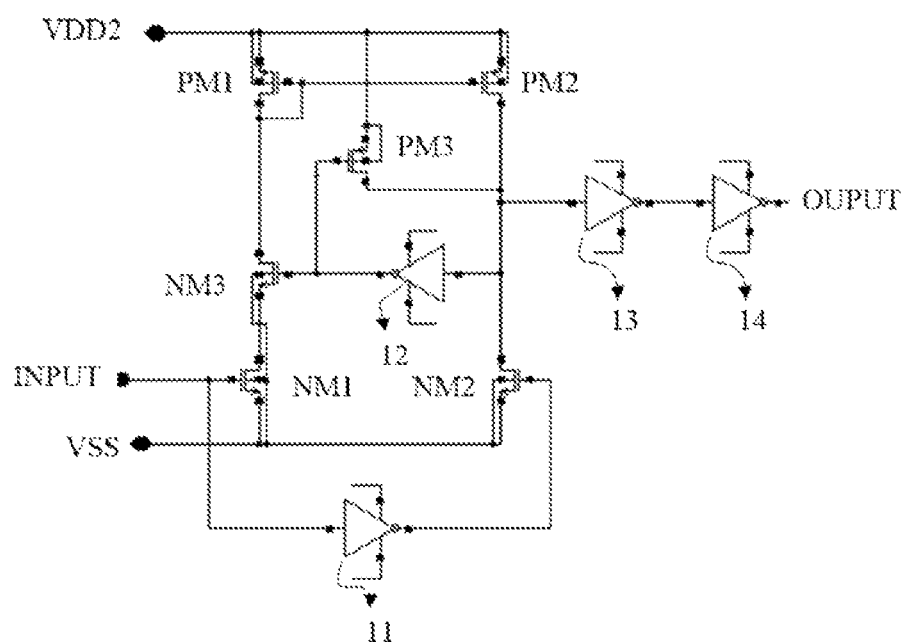
FIG. 1 is a circuit diagram of a level shifting circuit.

Referring to FIG. 1, a level shifting circuit includes a first inverter 11, a level shifting unit composed of a first PMOS transistor PM1, a second PMOS transistor PM2, a first NMOS transistor NM1, and a second NMOS transistor NM2, a current cut-off unit composed of a second inverter 12 and a third NMOS transistor NM3, a voltage clamping unit composed of the second inverter 12 and a third PMOS transistor PM3, and a rectifying unit composed of a third inverter 13 and a fourth inverter 14.

When an input signal of an input node INPUT of the level shifting circuit is a high-level signal, the first NMOS transistor NM1 is conducted, and the second NMOS transistor NM2 is cut off. When the first NMOS transistor NM1 is conducted, a voltage at a source terminal of the third NMOS transistor NM3 keeps dropping. When a voltage difference between a gate terminal and the source terminal of the third NMOS transistor NM3 reaches a threshold voltage of the third NMOS transistor NM3, the third NMOS transistor NM3 is conducted, so that the voltage at the source terminal of the third NMOS transistor NM3 keeps dropping. When the source terminal of the third NMOS transistor NM3 drops to a threshold voltage of the second PMOS transistor PM2, the second PMOS transistor PM2 is conducted. When the second PMOS transistor PM2 is conducted, a voltage at an output node OUTPUT of the level shifting unit is continuously pulled up until the voltage reaches a second power voltage VDD2, and then is rectified by the rectifying unit composed of the third inverter 13 and the fourth inverter 14 to be output.

When the second power voltage VDD2 is 1.8 V and a voltage of the input signal is greater than or equal to 1.0 V such as 1.0 V to 1.2 V, the level shifting circuit shown in FIG. 1 operates well and can pull up an input power voltage VDD1 with a lower amplitude to a power voltage VDD2 with a higher amplitude and output the power voltage. However, when the voltage of the input signal is less than 1.0 V, because a threshold voltage of the first NMOS transistor NM1 is higher, a conduction speed of the first NMOS transistor NM1 slows down, and even the first NMOS transistor NM1 cannot operate. As a result, the level shifting circuit operate slowly or fails to work.

To address the above problem, in the technical solution in embodiments and implementations of the present disclosure, when a fast driving unit receives the input signal, an output signal of the output node of the level shifting unit is pulled up by increasing a discharge current of the level shifting unit, so that normal operation of the level shifting circuit can be ensured when a level of the input signal is relatively low, thereby improving working reliability of the level shifting circuit and increasing an application range of the level shifting circuit.

Figure 2:
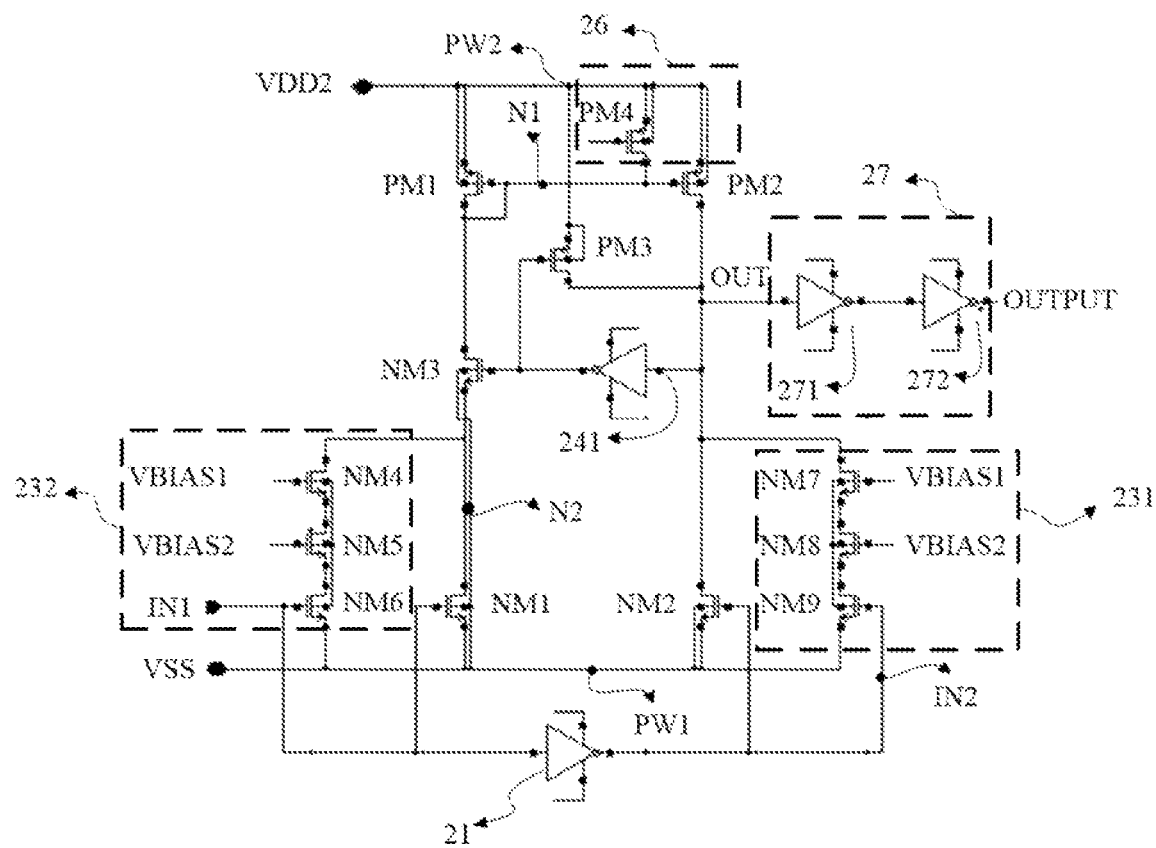
FIG. 2 is a circuit diagram of a level shifting circuit in one form of the present disclosure.

FIG. 2 is a schematic structural diagram of a level shifting circuit in one form of the present disclosure. Referring to FIG. 2, a level shifting circuit may include a first inverter 21, a level shifting unit, and a fast driving unit.

An input node of the first inverter 21 is coupled to an input node of the level shifting circuit, and an output node of the first inverter 21 is coupled to a second input node IN2 of the level shifting unit. When an input signal is a high-level signal, the input signal is directly supplied to a first input node IN1 of the level shifting unit. When the input signal is a low-level signal, the first inverter 21 inverts the input signal and supplies an inverted input signal to the second input node IN2 of the level shifting unit.

The level shifting unit has the first input node IN1, the second input node IN2, a first power node PW1, a second power node PW2, and an output node OUT. The first input node IN1 is coupled to the input node of the level shifting circuit, the second input node IN2 is coupled to the output node of the first inverter 21, the first power node PW1 is coupled to a first power voltage VSS, and the second power node PW2 is coupled to a second power voltage VDD2. The level shifting unit performs amplitude up-shifting processing on an input signal with a low amplitude (VSS to VDD1), thereby generating an output signal that changes between the second power voltage VDD2 and the first power voltage VSS. VSS<VDD1<VDD2.

In some implementations, the level shifting unit includes a first NMOS transistor NM1, a second NMOS transistor NM2, a first PMOS transistor PM1, and a second PMOS transistor PM2. A gate terminal of the first NMOS transistor NM1 is coupled to the first input node IN1 of the level shifting unit, a source terminal of the first NMOS transistor NM1 is coupled to the first power node PW1, and a drain terminal of the first NMOS transistor NM1 is coupled to a drain terminal of the first PMOS transistor PM1. The drain terminal of the first PMOS transistor PM1 is further coupled to a gate terminal of the first PMOS transistor PM1 and a gate terminal of the second PMOS transistor PM2 respectively, and a source terminal of the first PMOS transistor PM1 is coupled to the second power node PW2. A source terminal of the second PMOS transistor PM2 is coupled to the second power node PW2, and a drain terminal of the second PMOS transistor PM2 is coupled to the output node OUT of the level shifting unit. A gate terminal of the second NMOS transistor NM2 is coupled to the second input node IN2 of the level shifting unit, a source terminal of the second NMOS transistor NM2 is coupled to the first power node PW1, and a drain terminal of the second NMOS transistor NM2 is coupled to the drain terminal of the second PMOS transistor PM2.

The fast driving unit has a first bias voltage input node, a first second bias voltage input node, a first input node, a first current connection node, a first second current connection node, a second first bias voltage input node, a second bias voltage input node, a second input node, a second first current connection node, and a second current connection node. The first bias voltage input node and the second first bias voltage input node are both coupled to a preconfigured first bias voltage VBIAS1, the first second bias voltage input node and the second bias voltage input node are both coupled to a preconfigured second bias voltage VBIAS2, the first input node is coupled to the input node of the level shifting circuit, the second input node is coupled to an output node of the first inverter 21, the first current connection node is coupled to a second node N2, the first second current connection node is coupled to the first power node PW1, the second first current connection node is coupled to the output node OUT of the level shifting unit, and the second current connection node is coupled to the first power node PW1. When the received input signal is a high-level signal, the fast driving unit may increase a discharge current of a discharge path between the second power node PW2 and the first power node PW1, to quickly pull up an output voltage at the output node OUT of the level shifting unit to the second power voltage VDD2. When the received input signal is a low-level signal, the fast driving unit may increase a discharge current of a discharge path between the output node OUT of the level shifting unit and the first power node PW1, to quickly pull up an output signal of the output node OUT of the level shifting unit to the first power voltage VSS.

In some implementations, the fast driving unit includes a first fast driving subunit 231 and a second fast driving subunit 232.

The first fast driving subunit 231 has a first bias voltage input node, a first second bias voltage input node, a first input node, a first current connection node, and a first second current connection node. When the received input signal is a high-level signal, the first fast driving subunit may increase a discharge current of a discharge path between the second power node PW2 and the first power node PW1, to quickly pull up an output voltage at the output node OUT of the level shifting unit to the second power voltage VDD2.

The first fast driving subunit 231 specifically includes a fourth NMOS transistor NM4, a fifth NMOS transistor NM5, and a sixth NMOS transistor NM6. A gate terminal of the fourth NMOS transistor NM4 is coupled to the first bias voltage input node, a source terminal of the fourth NMOS transistor NM4 is coupled to a drain terminal of the fifth NMOS transistor NM5, and a drain terminal of the fourth NMOS transistor NM4 is coupled to the second node N2. A gate terminal of the fifth NMOS transistor NM5 is coupled to the first second bias voltage input node, and a source terminal of the fifth NMOS transistor NM5 is coupled to a drain terminal of the sixth NMOS transistor NM6. A gate terminal of the sixth NMOS transistor NM6 is coupled to the first input node, and a source terminal of the sixth NMOS transistor NM6 is coupled to the first power node PW1.

The second fast driving subunit 232 has a second first bias voltage input node, a second second bias voltage input node, a second input node, a second first current connection node, and a second current connection node. When the received input signal is a low-level signal, the second fast driving subunit 232 may increase a discharge current of a discharge path between the output node OUT of the level shifting unit and the first power node PW1, to quickly pull up the output voltage at the output node OUT of the level shifting unit to the first power voltage VSS.

The second fast driving subunit 232 specifically includes a seventh NMOS transistor NM7, an eighth NMOS transistor NM8, and a ninth NMOS transistor NM9. A gate terminal of the seventh NMOS transistor NM7 is coupled to the second first bias voltage input node, a source terminal of the seventh NMOS transistor NM7 is coupled to a drain terminal of the eighth NMOS transistor NM8, and a drain terminal of the seventh NMOS transistor NM7 is coupled to the output node OUT of the level shifting circuit. A gate terminal of the eighth NMOS transistor NM8 is coupled to the second bias voltage input node, and a source terminal of the eighth NMOS transistor NM8 is coupled to a drain terminal of the ninth NMOS transistor NM9. A gate terminal of the ninth NMOS transistor NM9 is coupled to the output node of the first inverter 21, and a source terminal of the ninth NMOS transistor NM9 is coupled to the first power node PW1.

In some implementations, the fourth NMOS transistor and the seventh NMOS transistor are both thick-gate-oxide NMOS transistors, and the fifth NMOS transistor, the sixth NMOS transistor, the eighth NMOS transistor, and the ninth NMOS transistor are all thin/thick-gate-oxide NMOS transistors. Compared with a thick-gate-oxide NMOS transistor, a thin-gate-oxide NMOS transistor has a larger conduction current when being conducted, and has a stronger driving ability to quickly pull down a voltage at a source terminal of the first NMOS transistor, so that a conduction speed of the second PMOS transistor PM2 can be increased and an operation speed of the level shifting circuit can be increased. In addition, compared with the thick-gate-oxide NMOS transistor, the thin/thick-gate-oxide NMOS transistor has a lower threshold voltage, and can be quickly conducted when an input voltage INPUT is lower than 1.0 V, thereby ensuring a working speed and performance of the level shifting circuit.

It should be noted that, in order to ensure working reliability of the first fast driving subunit 231 and the second fast driving subunit 232, the first bias voltage VBIAS1 and the second bias voltage VBIAS2 need to be maintained in a stable state. Details are as follows:

The first bias voltage VBIAS1 is coupled to the gate terminal of the fourth NMOS transistor and the gate terminal of the seventh NMOS transistor respectively. When the gate terminal of the fourth NMOS transistor and the seventh NMOS transistor are in a conducting state, the first bias voltage VBIAS1 determines a voltage at the source terminal of the fourth NMOS transistor and a voltage at the source terminal of the seventh NMOS transistor respectively. In addition, the source terminal of the fourth NMOS transistor is coupled to the drain terminal of the fifth NMOS transistor, and the source terminal of the seventh NMOS transistor is coupled to the drain terminal of the eighth NMOS transistor. Therefore, the first bias voltage VBIAS1 greatly affects working reliability of the fifth NMOS transistor and the eighth NMOS transistor. In an embodiment of the present disclosure, when the second power voltage VDD2 equal to 1.8 V, the first bias voltage VBIAS1 is 1.3 V to 1.4 V. In order to ensure stability of the first bias voltage VBIAS1, the first bias voltage VBIAS1 may be generated by connecting a voltage divider resistor to the second power node PW2 to control an amplitude of the first bias voltage VBIAS1 within 10%. Therefore, the reliability of the fifth NMOS transistor and the eighth NMOS transistor can be ensured.

The second bias voltage VBIAS2 is coupled to the gate terminal of the fifth NMOS transistor and the gate terminal of the eighth NMOS transistor respectively, the fourth NMOS transistor and the seventh NMOS transistor are thick gate oxygen oxide NMOS transistors, and the fifth NMOS transistor and the eighth NMOS transistor are thin-gate-oxide NMOS transistors. Therefore, the second bias voltage VBIAS2 coupled to the gate terminal of the fifth NMOS transistor and the gate terminal of the eighth NMOS transistor is less than the first bias voltage VBIAS1 coupled to the gate terminal of the fourth NMOS transistor and the gate terminal of the seventh NMOS transistor. In some implementations, when the second power voltage VDD2 is equal to 1.8 V and the first bias voltage VBIAS1 is 1.3 V to 1.4 V, the second bias voltage VBIAS2 is 0 V to 0.9 V.

It should be noted that, in actual operation, the second bias voltage VBIAS2 is generally directly generated by coupling with a corresponding power voltage. However, when the second bias voltage VBIAS2 is an ultra-low power voltage lower than 0.5 V, driving capabilities of the fifth NMOS transistor and the eighth NMOS transistor are greatly reduced. Therefore, in order to ensure good working performance of the fifth NMOS transistor and the eighth NMOS transistor, similar to the first bias voltage VBIAS1, the second bias voltage may be generated by connecting a second voltage divider resistor to the second power voltage node PW2 to control an amplitude of the second bias voltage VBIAS2 within 10%., so that the driving capabilities of the fifth NMOS transistor and the eighth NMOS transistor are increased when the second bias voltage VBIAS2 is lower than 0.5 V.

In some implementations, a discharge path formed by the first fast driving subunit 231 is added, so that the voltage of the output node OUT of the level shifting unit can be quickly pulled up when the received input signal is a high-level signal. In particular, when the received input signal is a high-level signal, the first fast driving subunit 231 starts discharging before the first NMOS transistor NM1 is conducted, and then the first NMOS transistor NM1 is conducted and performs discharging together with the first fast driving subunit 231. In comparison with only one discharge path formed by the first NMOS transistor NM1 in the level shifting circuit shown in FIG. 1, a pull-down speed of a voltage of the second node N2 can be increased. When the pull-down speed of the voltage of the second node N2 is increased, the third NMOS transistor is also conducted accordingly in advance. Then, a pull-down speed of a voltage of the first node N1 can be increased, and the conduction speed of the second PMOS transistor can be increased, so that the voltage of the output node OUT of the level shifting unit can be quickly pulled up.

In some implementations, a discharge path formed by the second fast driving subunit 232 is added, so that the voltage of the output node OUT of the level shifting unit can be quickly pulled up when the received input signal is a low-level signal. In particular, when the received input signal is a low-level signal, the second fast driving subunit 232 starts discharging before the second NMOS transistor NM2 is conducted, and then the second NMOS transistor NM2 is conducted and performs discharging together with the second fast driving subunit 232. In comparison with only one discharge path formed by the second NMOS transistor NM2 in the level shifting circuit shown in FIG. 1, a pull-down speed of the voltage of the output node OUT of the level shifting unit can be increased, and the voltage of the output node OUT of the level shifting unit can be quickly pulled up.

In some implementations, the level shifting circuit may further include a current cut-off unit. The current cut-off unit has an input node, a first current connection node, and a second current connection node. The input node of the current cut-off unit is coupled to the output node OUT of the level shifting circuit 21, the first current connection node of the current cut-off unit is coupled to the drain terminal of the first PMOS transistor PM1, and the second current connection node of the current cut-off unit is coupled to the second node N2. The current cut-off unit may cut off the discharge path between the second power node PW2 and the first power node PW1 when the output signal of the output node OUT of the level shifting circuit 21 is a high-level signal, to avoid energy waste.

In some implementations, the current cut-off unit includes a second inverter 241 and a third NMOS transistor NM3. An input node of the second inverter 241 is coupled to the input node of the current cut-off unit, and an output node of the second inverter 241 is coupled to a gate terminal of the third NMOS transistor NM3. A source terminal of the third NMOS transistor NM3 is coupled to the second node N2, and a drain terminal of the third NMOS transistor NM3 is coupled to the drain terminal of the first PMOS transistor PM1.

In some implementations, the level shifting circuit 20 may further include a first voltage clamping unit. The first voltage clamping unit has an input node, a first current connection node, and a second current connection node. The input node of the first voltage clamping unit is coupled to the output node OUT of the level shifting unit, the first current connection node of the first voltage clamping unit is coupled to the second power node PW2, and the second current connection node of the first voltage clamping unit is coupled to the output node OUT of the level shifting unit. The first voltage clamping unit is configured to clamp the voltage of the output signal of the output node OUT of the level shifting unit at a high level when the output signal of the output node OUT of the level shifting unit is a high-level signal, to prevent the high-level signal output by the output node OUT of the level shifting unit from floating.

In some implementations, the first voltage clamping unit includes the second inverter 241 and a third PMOS transistor PM3. The input node of the second inverter 241 is coupled to the input node of the first voltage clamping unit, the output node of the second inverter 241 is coupled to a gate terminal of the third PMOS transistor PM3, a source terminal of the third PMOS transistor PM3 is coupled to the first current connection node of the first voltage clamping unit, and a drain terminal of the third PMOS transistor PM3 is coupled to the second current connection node of the first voltage clamping unit.

In some implementations, the level shifting circuit 20 may further include a second voltage clamping unit 26. The second voltage clamping unit 26 has a control node, a first current connection node, and a second current connection node. The control node of the second voltage clamping unit 26 is coupled to the output node OUT of the level shifting unit, the first current connection node of the second voltage clamping unit 26 is coupled to the second power node PW2, and the second current connection node of the second voltage clamping unit 26 is coupled to the first node N1. The second voltage clamping unit 26 is configured to clamp a voltage of the first node N1 at the second power voltage VDD2 when the output signal of the output node OUT of the level shifting unit is a low-level signal, so that when the output signal of the output node of the level shifting unit is a low-level signal, an anti-interference capability of the first node N1 is enhanced, thereby enhancing an anti-interference capability of the output node of the level shifting unit and improving robustness of the level shifting circuit.

In some implementations, the second voltage clamping unit 26 includes a fourth PMOS transistor PM4. A gate terminal of the fourth PMOS transistor PM4 is coupled to the control node of the second voltage clamping unit 26, a source terminal of the fourth PMOS transistor PM4 is coupled to the first current connection node of the second voltage clamping unit 26, and a drain terminal of the fourth PMOS transistor PM4 is coupled to the second current connection node of the second voltage clamping unit 26.

The gate terminal of the fourth PMOS transistor is coupled to the output node of the level shifting unit, the source terminal of the fourth PMOS transistor is coupled to the second power node, and the drain terminal of the fourth PMOS transistor is coupled to the first node.

In some implementations, the level shifting circuit 20 may further include a rectifying unit 27. The rectifying unit 27 includes an input node and an output node. The input node of the rectifying unit 27 is coupled to the output node OUT of the level shifting unit, and the output node of the rectifying unit 27 is coupled to the output node OUPUT of the level shifting circuit. The rectifying unit 27 is configured to rectify the output signal output by the output node OUT of the level shifting unit and output a rectified output signal.

In some implementations, the rectifying unit 27 includes a third inverter 271 and a fourth inverter 272. An input node of the third inverter 271 is coupled to the input node of the rectifying unit 27, an output node of the third inverter 271 is coupled to an input node of the fourth inverter 272, and an output node of the fourth inverter 272 is coupled to the output node of the rectifying unit 27.

Figure 3:
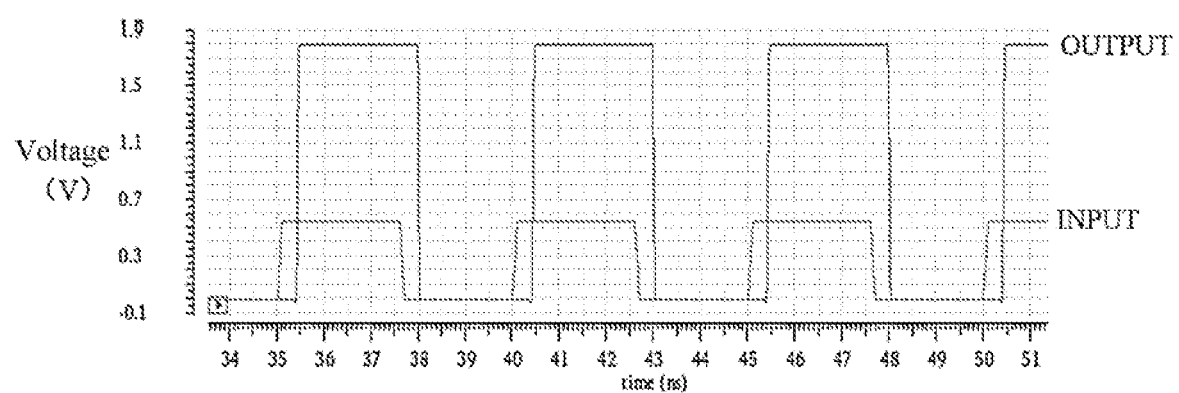
FIG. 3 is a schematic diagram of simulation results of an input signal and an output signal of a level shifting circuit in one form of the present disclosure.

FIG. 3 is a schematic diagram of simulation results of an input signal and an output signal of a level shifting circuit in an embodiment of the present disclosure. Referring to FIG. 3, when the second power voltage is 1.8 V and the input signal of the input node is 0.55 V, the voltage output by the output node of the shift circuit in this embodiment of the present disclosure is 1.8 V. The input signal of the level shifting circuit in this embodiment of the present disclosure ranges from 0.5 V to 1.2 V, and the input signal of the level shifting circuit shown in FIG. 1 ranges from 0.7 V to 1.2 V. Therefore, a lower limit value of an input voltage of the level shifting circuit in this embodiment of the present disclosure is lower than a lower limit value of the input signal of the level shifting circuit shown in FIG. 2 by 200 mV, so that quick and reliable level up-shifting can be achieved when the input signal is an ultra-low power voltage of 0.5 V.

In embodiments and implementations of the present disclosure, when the fast driving unit receives the input signal, the output signal of the output node of the level shifting unit is quickly pulled up by increasing the discharge current of the level shifting unit, so that normal operation of the level shifting circuit can be ensured when a level of the input signal is relatively low, thereby improving working reliability of the level shifting circuit and increasing an application range of the level shifting circuit.

Although embodiments and implementations of the present disclosure are disclosed above, the present disclosure is not limited thereto. Any person skilled in the art can make various changes and modifications without departing from the spirit and the scope of the present disclosure, and therefore the protection scope of the present disclosure should be subject to the scope defined by the claims.

What is claimed is:

1. A level shifting circuit, comprising:
   a first inverter adapted to invert an input signal received by an input node of the level shifting circuit and output an inverted input signal to a second input node of a level shifting unit, an input node of the first inverter being coupled to the input node of the level shifting circuit, and an output node of the first inverter being coupled to the second input node of the level shifting unit;
   the level shifting unit adapted to perform amplitude up-shifting processing on the input signal received by the input node of the level shifting circuit, a first input node of the level shifting unit being coupled to the input node of the level shifting circuit, the second input node of the level shifting unit being coupled to the output node of the first inverter, a first power node of the level shifting unit being coupled to a first power voltage, and a second power node of the level shifting unit being coupled to a second power voltage, wherein:

the level shifting unit comprises a first N-type metal-oxide-semiconductor (NMOS) transistor, a second NMOS transistor, a first P-type metal-oxide-semiconductor (PMOS) transistor, and a second PMOS transistor, a gate terminal of the first NMOS transistor being coupled to the first input node of the level shifting unit, a source terminal of the first NMOS transistor being coupled to the first power node, and a drain terminal of the first NMOS transistor being coupled to a drain terminal of the first PMOS transistor;

the drain terminal of the first PMOS transistor being further coupled to a gate terminal of the first PMOS transistor and to a gate terminal of the second PMOS transistor, and a source terminal of the first PMOS transistor being coupled to the second power node;

a source terminal of the second PMOS transistor being coupled to the second power node, and a drain terminal of the second PMOS transistor being coupled to the output node of the level shifting unit; and a gate terminal of the second NMOS transistor being coupled to the output node of the first inverter, a source terminal of the second NMOS transistor being coupled to the first power node, and a drain terminal of the second NMOS transistor being coupled to the output node of the level shifting unit;

a fast driving unit adapted to pull up an output signal of an output node of the level shifting unit by increasing a discharge current of the level shifting unit when receiving the input signal; and a current cut-off unit adapted to cut off a discharge path between the second power node and the first power node in response to the output signal of the output node of the level shifting unit being a high-level signal.

2. The level shifting circuit according to claim 1, wherein:
the current cut-off unit comprises a second inverter and a third NMOS transistor,
an input node of the second inverter being coupled to the output node of the level shifting unit, and an output node of the second inverter being coupled to a gate terminal of the third NMOS transistor; and
a source terminal of the third NMOS transistor being coupled to the drain terminal of the first NMOS transistor, and a drain terminal of the third NMOS transistor being coupled to the drain terminal of the first PMOS transistor.

3. The level shifting circuit according to claim 2, further comprising:
a first voltage clamping unit adapted to clamp the output signal of the output node of the level shifting unit at a high level in response to the output signal of the output node of the level shifting unit being a high-level signal.

4. The level shifting circuit according to claim 3, wherein:
the first voltage clamping unit comprises a third PMOS transistor and the second inverter,
a gate terminal of the third PMOS transistor being coupled to the output node of the second inverter, a source terminal of the third PMOS transistor being coupled to the second power node, and a drain terminal of the third PMOS transistor being coupled to the output node of the level shifting unit.

5. The level shifting circuit according to claim 4, further comprising:
a rectifying unit coupled between the output node of the level shifting unit and an output node of the level shifting circuit and adapted to rectify the output signal of the output node of the level shifting unit and output a rectified output signal.

6. The level shifting circuit according to claim 5, wherein the rectifying unit comprises a third inverter and a fourth inverter,
an input node of the third inverter being coupled to the output node of the level shifting unit, an output node of the third inverter being coupled to an input node of the fourth inverter, and an output node of the fourth inverter being coupled to the output node of the level shifting circuit.

7. A level shifting circuit, comprising:
a first inverter adapted to invert an input signal received by an input node of the level shifting circuit and output an inverted input signal to a second input node of a level shifting unit, an input node of the first inverter being coupled to the input node of the level shifting circuit, and an output node of the first inverter being coupled to the second input node of the level shifting unit;

the level shifting unit adapted to perform amplitude up-shifting processing on the input signal received by the input node of the level shifting circuit, a first input node of the level shifting unit being coupled to the input node of the level shifting circuit, the second input node of the level shifting unit being coupled to the output node of the first inverter, a first power node of the level shifting unit being coupled to a first power voltage, and a second power node of the level shifting unit being coupled to a second power voltage, wherein:

the level shifting unit comprises a first N-type metal-oxide-semiconductor (NMOS) transistor, a second NMOS transistor, a first P-type metal-oxide-semiconductor (PMOS) transistor, and a second PMOS transistor, a gate terminal of the first NMOS transistor being coupled to the first input node of the level shifting unit, a source terminal of the first NMOS transistor being coupled to the first power node, and a drain terminal of the first NMOS transistor being coupled to a drain terminal of the first PMOS transistor;

the drain terminal of the first PMOS transistor being further coupled to a gate terminal of the first PMOS transistor and to a gate terminal of the second PMOS transistor, and a source terminal of the first PMOS transistor being coupled to the second power node;

a source terminal of the second PMOS transistor being coupled to the second power node, and a drain terminal of the second PMOS transistor being coupled to the output node of the level shifting unit; and a gate terminal of the second NMOS transistor being coupled to the output node of the first inverter, a source terminal of the second NMOS transistor being coupled to the first power node, and a drain terminal of the second NMOS transistor being coupled to the output node of the level shifting unit; and a fast driving unit adapted to pull up an output signal of an output node of the level shifting unit by increasing a discharge current of the level shifting unit when receiving the input signal, wherein:
the fast driving unit comprises a first fast driving subunit and a second fast driving subunit,
the first fast driving subunit being adapted to increase a discharge current of a discharge path between the second power node and the first power node in response to an input signal of an input node of the level shifting unit being a high-level signal; and
the second fast driving subunit being adapted to increase a discharge current of a discharge path between the output node of the level shifting unit and the first power node in response to the input signal of the input node of the level shifting unit being a low-level signal.

8. The level shifting circuit according to claim 7, wherein:
the first fast driving subunit comprises a fourth NMOS transistor, a fifth NMOS transistor, and a sixth NMOS transistor,
a gate terminal of the fourth NMOS transistor being coupled to a preconfigured first bias voltage, a source terminal of the fourth NMOS transistor being coupled to a drain terminal of the fifth NMOS transistor, and a drain terminal of the fourth NMOS transistor being coupled to the drain terminal of the first NMOS transistor;
a gate terminal of the fifth NMOS transistor being coupled to a preconfigured second bias voltage, and a source terminal of the fifth NMOS transistor being coupled to a drain terminal of the sixth NMOS transistor; and
a gate terminal of the sixth NMOS transistor being coupled to the input node of the level shifting circuit, and a source terminal of the sixth NMOS transistor being coupled to the first power node.

9. The level shifting circuit according to claim 8, wherein the fourth NMOS transistor is a thick-gate-oxide NMOS transistor, and the fifth NMOS transistor and the sixth NMOS transistor are thin/thick-gate-oxide NMOS transistors.

10. The level shifting circuit according to claim 8, wherein:
the second fast driving subunit comprises a seventh NMOS transistor, an eighth NMOS transistor, and a ninth NMOS transistor,
a gate terminal of the seventh NMOS transistor being coupled to the first bias voltage, a source terminal of the seventh NMOS transistor being coupled to a drain terminal of the eighth NMOS transistor, and a drain terminal of the seventh NMOS transistor being coupled to the output node of the level shifting unit;
a gate terminal of the eighth NMOS transistor being coupled to the second bias voltage, and a source terminal of the eighth NMOS transistor being coupled to a drain terminal of the ninth NMOS transistor; and
a gate terminal of the ninth NMOS transistor being coupled to the output node of the first inverter, and a source terminal of the ninth NMOS transistor being coupled to the first power node.

11. The level shifting circuit according to claim 10, wherein the seventh NMOS transistor is a thick-gate-oxide NMOS transistor, and the eighth NMOS transistor and the ninth NMOS transistor are thin/thick-gate-oxide NMOS transistors.

12. The level shifting circuit according to claim 8, wherein:
the first bias voltage is generated by a first bias voltage generating circuit,
the first bias voltage generating circuit comprising the second power voltage and a first voltage divider resistor coupled to the second power node; and
a first end of the first voltage divider resistor being coupled to the second power node, and a second end of the first voltage divider resistor serving as an output node of the first bias voltage generating circuit.

13. The level shifting circuit according to claim 8, wherein:
the second bias voltage is generated by a second bias voltage generating circuit,
the second bias voltage generating circuit comprising the second power voltage and a second voltage divider resistor coupled to the second power node; and
a first end of the second voltage divider resistor being coupled to the second power node, and a second end of the second voltage divider resistor serving as an output node of the second bias voltage generating circuit.

14. The level shifting circuit according to claim 8, wherein in response to the second power voltage being 1.8 V, the first bias voltage is 1.3 V to 1.4 V, and the second bias voltage is 0 V to 0.9 V.

15. The level shifting circuit according to claim 8, wherein the gate terminal of the first PMOS transistor and the gate terminal of the second PMOS transistor are used as a first node, and the level shifting circuit further comprises:
a second voltage clamping unit adapted to clamp a voltage of the first node at a high level in response to the output signal of the output node of the level shifting unit being a low-level signal.

16. The level shifting circuit according to claim 15, wherein the second voltage clamping unit comprises a fourth PMOS transistor,
a gate terminal of the fourth PMOS transistor being coupled to the output node of the level shifting unit, a source terminal of the fourth PMOS transistor being coupled to the second power node, and a drain terminal of the fourth PMOS transistor being coupled to the first node.

* * * * *